United States Patent [19]

Thiel

[11] Patent Number: 5,363,059
[45] Date of Patent: Nov. 8, 1994

[54] TRANSCONDUCTANCE AMPLIFIER

[75] Inventor: Fran L. Thiel, Richardson, Tex.

[73] Assignee: Texas Instruments Incorporated, Dallas, Tex.

[21] Appl. No.: 78,385

[22] Filed: Jun. 17, 1993

[51] Int. Cl.$^5$ ............................................. H03F 3/45
[52] U.S. Cl. .................................. 330/253; 330/255; 330/257
[58] Field of Search ...................... 330/253, 255, 257

[56] References Cited

U.S. PATENT DOCUMENTS 4,935,703  6/1990  Poletto ............................. 330/255

FOREIGN PATENT DOCUMENTS 0023246  2/1977  Japan ................................ 330/257

OTHER PUBLICATIONS

Fisher, "A High-Performance CMOS Power Amplifier," *IEEE Journal of Solid-State Circuits*, vol. SC-34, No. 6 Dec. 1985, pp. 1200-1205.

Stocchino, "High Efficiency MOSFET Power Amplifier", *Electronic Engineering*, Apr. 1984, pp. 34, 36.

*Primary Examiner*—James B. Mullins
*Attorney, Agent, or Firm*—Thomas G. Eschweiler; James C. Kesterson; Richard L. Donaldson

[57] ABSTRACT

A transconductance amplifier 12 includes a differential input connected to a current amplification network and a source follower output connected to the current amplification network. The CMOS topology coupled with the source follower type output provide an extremely low current, low output impedance transconductance amplifier. The source follower output includes low threshold voltage transistors that also provide an extremely large output voltage swing.

3 Claims, 1 Drawing Sheet

TRANSCONDUCTANCE AMPLIFIER

FIELD OF THE INVENTION

This invention is in the field of electronic circuits relating to amplifiers and is more particularly related to transconductance amplifier circuits.

BACKGROUND OF THE INVENTION

Transconductance amplifiers are frequently used in applications where a controlled current must be delivered to a load, especially a capacitive load. Transconductance amplifiers have substantially low voltage gain characteristics that are beneficial in aiding output voltage stability in negative feedback loop situations. A problem in utilizing transconductance amplifiers is that external performance requirements often necessitate design tradeoffs in the amplifier between important parameters such as high output swing, low output impedance, and low quiescent current.

Amplifiers need a large output swing when driving switches because in order to turn the switches on or off the output of a transconductance amplifier must be relatively high (very near Vcc) while, on the other end (such as under a drop out condition, which is well known by those skilled in the art) the output of a transconductance amplifier needs to go as low as possible.

Transconductance amplifiers often drive a capacitive load. The slew rate of the amplifier output is determined by: $t_{slew} = r_o * C$, where $r_o$ equals the output impedance of a transconductance amplifier and C equals the capacitance of the capacitive load. It is often desirable for the slew rate to be as low as possible so that the load capacitance will change states as quickly as possible. Therefore, to minimize the slew rate one needs to provide a low output impedance for the transconductance amplifier. However, maximizing the design of a transconductance amplifier to suit low output impedance considerations is in conflict with the desire for a transconductance amplifier to have high output swing. Typical amplifier designs use an open drain output configuration to maximize the output swing, yet an open drain output configuration has a large output impedance. A standard source follower type output configuration, although providing low output impedance suffers from low output swing. Further, maximizing the design of a transconductance amplifier for minimum slew rate is also in conflict with the desire for a transconductance amplifier to have as low a quiescent current as possible.

Low quiescent current is desirable in order to minimize the power efficiency loss of the system circuitry. However, the output impedance of a transconductance amplifier is inversely proportional to its current. Minimizing design choices for low output impedance necessitates increasing quiescent current. These conflicts in transconductance amplifier performance parameters has limited the use of transconductance amplifiers in applications that have required high output swing, low output impedance, and low quiescent current.

What is needed and what is desirable, therefore, is a transconductance amplifier free from the past constraining design tradeoffs. It is accordingly an object of the invention to provide an improved transconductance amplifier.

It is a further object of the invention to provide a transconductance amplifier having low quiescent current, high output swing, and low output impedance. Other objects and advantages of the invention will become apparent to those of ordinary skill in the art having reference to the following specification together with the drawings herein.

SUMMARY OF THE INVENTION

A transconductance amplifier 12 includes a differential input connected to a current amplification network and a source follower output connected to the current amplification network. The CMOS topology coupled with the source follower type output provide an extremely low current, low output impedance transconductance amplifier. The source follower output includes low threshold voltage transistors that also provide an extremely large output voltage swing.

DESCRIPTION OF THE PREFERRED EMBODIMENT

Figure 1:
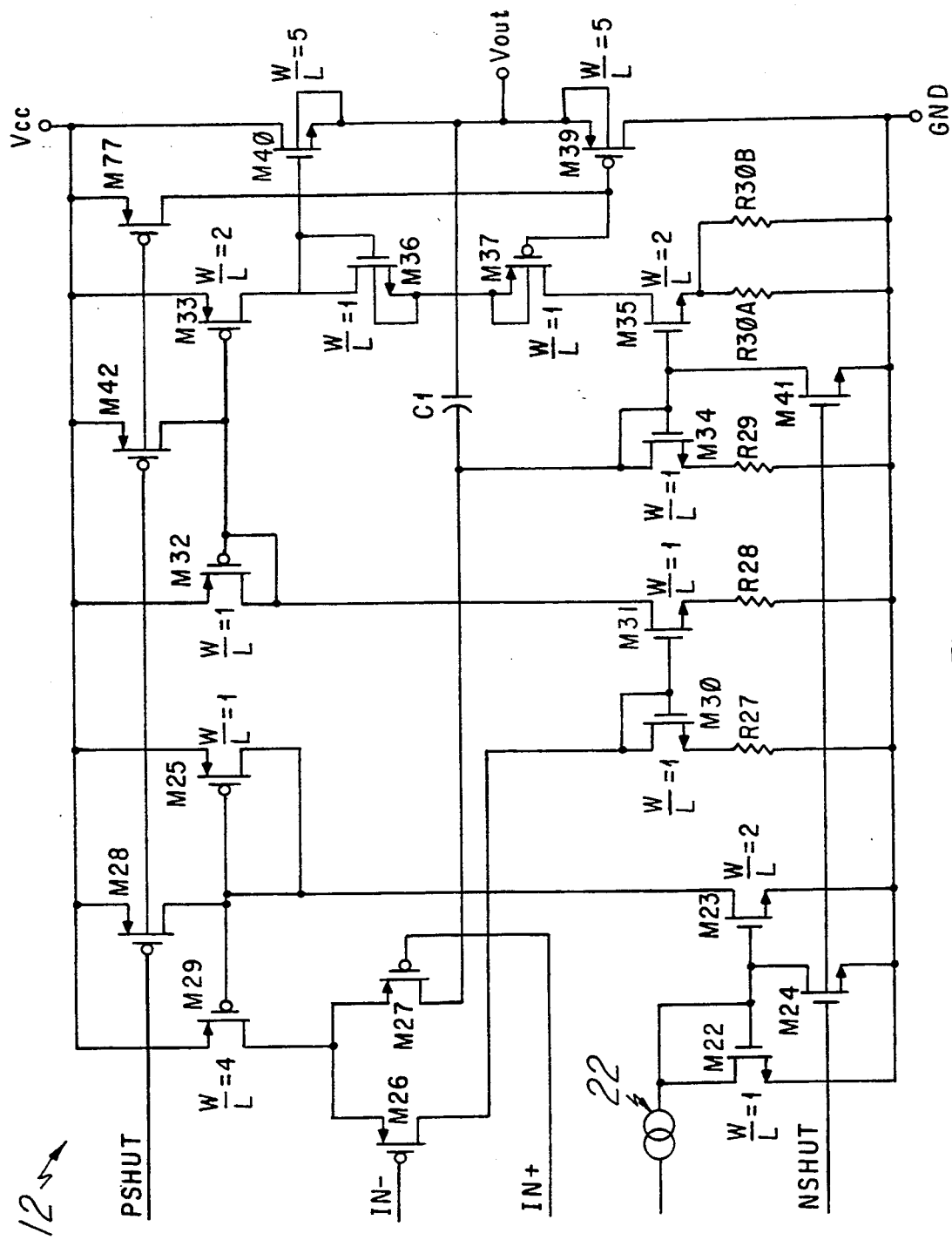
FIG. 1 is a schematic diagram illustrating the preferred embodiment of the invention, a transconductance amplifier 12.

With reference to FIG. 1, a structural description of the invention follows below. FIG. 2 is a schematic diagram illustrating the preferred embodiment of the invention, a transconductance amplifier 12. Amplifier 12 has a differential pair input made of two PMOS transistors M26 and M27. M26 and M27 each have a source connected together while the gate of M26 is connected to an IN− input and the gate of M27 is connected to an IN+ input. A drain of M26 is connected to a drain of an NMOS transistor M30 and a drain of M27 is connected to a first terminal of capacitor C1. The drain of M30 is connected to its gate and a gate of an NMOS transistor M31. A source of M30 is connected to a resistor R27 which in turn is connected to ground. A source of M31 is connected to a resistor R28 which is also connected to ground. M30 and M31 form a current mirror. The sources of M26 and M27 are connected to a drain of a PMOS transistor M29. M29 has a source connected to Vcc and a gate connected to a gate of a PMOS transistor M25. M25 has a drain connected to its gate and source connected to Vcc. M25 and M29 form a current mirror. The gates of M29 and M25 are connected to a drain of a PMOS transistor M28. M28 has a gate connected to a PSHUT input and a source connected to Vcc. The drain of M25 is also connected to a drain of an NMOS transistor M23. M23 has a gate connected to a gate of an NMOS transistor M22. M23 also has a source connected to ground. M22 has a drain connected to its gate and to a current source 22. M22 also has a source connected to ground. M22 and M23 form a current mirror. The gates of M22 and M23 are connected to a drain of an NMOS transistor M24. M24 has a gate connected to an NSHUT input and a source connected to ground. The drain of M31 is connected to a drain of a PMOS transistor M32. M32 has a gate connected to its drain and to a gate of a PMOS transistor M33. M32 and M33 both have a source connected to Vcc. The gates of M32 and M33 are connected to a drain of a PMOS transistor M42 which has a gate connected to PSHUT. M42 also has a source connected to Vcc. M32 and M33 form a current mirror. The drain of M27 is connected to a drain of an NMOS transistor M34. M34 has a gate connected to its drain and to a gate of an NMOS transistor M35. M34 also has a source connected to a resistor R29 which in turn is connected to ground. M35 has a source connected to two resistors R30A and R30B which are connected in parallel to ground. R30A and R30B can alternatively be replaced by a single resistance having half the value of R29. The gates of M34 and M35 are connected to a drain of an NMOS transistor M41 which has a gate connected to NSHUT and a source connected to ground. M35 has a drain connected to a drain and gate of a PMOS transistor M37. M37 has a source connected to a source of an NMOS transistor M36. M36 has a drain and a gate that are both connected to the drain of M33. The drain of M36 is also connected to a gate of an NMOS transistor M40. M40 has a drain connected to Vcc and a source connected to a second terminal of capacitor C1 and to a source of a PMOS transistor M39. M39 has a gate connected to the drain of M35 and a drain connected to ground. The gate of M39 is connected to a drain of a PMOS transistor M77 which has a gate connected to PSHUT and a source connected to Vcc. The combination of the sources of M39 and M40 forms the output of amplifier 12.

Again, with reference to FIG. 1, a functional description of the invention follows below; amplifier 12 provides low current and low output impedance with a high output swing in the following manner. Assuming, for a first case, that inputs IN+ and IN− are equal, transistors M26 and M27 both conduct equally, drawing the same amount of current. Current source 22 supplies a single unit of current to the drain of M22 which is in saturation since its drain is connected to its gate and it is an enhancement mode MOS device. M22 and M23 form a current mirror and since M23 is 2X M22 in its W/L ratio, M23 conducts two units of current as is well known by those skilled in the art. Since M23 is connected in series with M25, M25 also conducts two units of current since it too is biased in saturation. M25 and M29 form a current mirror and since M29 is 4X M25 then the current flowing through M29 is eight units of current. The current in M29 feeds differential pair M26 and M27. Since IN+ and IN− are equal the eight units of current are evenly distributed between M26 and M27, therefore M26 and M27 each have four units of current flowing through them. M26 feeds the drain of M30 which forms a current mirror with M31. Since M30 and M31 are the same size, both transistors carry the same current value. Since the current in M30 is four units of current due to M26, M31 also has four units of current. M31 is connected in series with M32 which is in saturation, thus mandating four units of current. M32 forms a current mirror with M33. Since M33 is 2X M32, eight units of current flow through M33. The drain of M27, which is conducting four units of current, is connected to the drain of M34 which is configured as a current mirror with M35. Since M35 is 2X M34, M35 conducts eight units of current. The current flowing through M34 will create a voltage across R29. Resistors R30A and R30B, which are matched with R29, exist to create the same voltage at the source of M35. In this way M34 and M35 both have the same $V_{gs}$ ensuring accurately that eight units of current will conduct through M35. Transistors M36 and M40 act as a current mirror. Since M40 is 5X M36 the current through M40 is 5X the current through M36. Since M36 has eight units of current M40 will have 40 units of current. M37 and M39 also form a current mirror. Since M39 is 5X M37 it conducts 5X the current of M37. Therefore M39 conducts 40 units of current. Therefore, when IN− = IN+ a DC current through M40 and M39 is produced that is 40X the current introduced by current source 22. In this instance, no current is produced at the output of amplifier 12.

C1 is a compensation capacitor that provides closed loop stability for amplifier 12 by introducing a low frequency pole which is well known by those skilled in the art of circuit design. Resistors R27, R28, R29, R30A, and R30B reduce the noise in amplifier 12 by decoupling the NMOS channels from their back-gates.

In the case where IN+ >IN− (note that the difference between IN+ and IN− in this case is very small and therefore constitutes a small signal in reference to the DC bias on those inputs), M27 conducts less than M26 and the eight units of current flowing through M29 is not shared equally by M27 and M26. This can be represented in the following way: M26 conducts 4+ units of current and M27 conducts 4− units of current; therefore $I_{(M26)}>I_{(M27)}$ and $(4+)-(4-) <<1$. This difference represents the small signal current in amplifier 12. As a result the current in M36 is 8+ units of current and the current in M37 is 8− units of current and therefore the current in M40 is 40+ units of current and current in M39 is 40− units of current. Thus the voltage difference between IN+ and IN− causes M40 to conduct more than M39 and the output of amplifier 12 will therefore source a small current $(I_{out}=(40+)-(40-))$. Further, M40 will pull the output of amplifier 12 up toward Vcc. Ideally, $V_{out}$ would be able to reach the potential of Vcc, however, as $V_{out}$ approaches Vcc it gets within a $V_{T(M40)}$ of Vcc and M40 stops conducting. This is a fundamental constraint in using MOS sources as outputs. However, M40, in this embodiment, is advantageously constructed as an extremely low $V_t$ transistor $(V_t \approx 0.1V)$. Therefore, $V_{out}$ has a much greater output swing than prior art transconductance amplifiers. In this embodiment, $V_{out}$ gets within 0.31V of Vcc in the preferred embodiment as compared with prior art where $V_{out}$ may not get to within 1V of Vcc.

When IN− >IN+ M27 conducts 4+ units of current and M26 conducts 4− units of current. Therefore, M37 conducts 8+ units of current and M36 conducts 8− units of current causing M40 to conduct 40− units of current and M39 to conduct 40+ units of current. This difference causes M39 to conduct more than M40 causing M39 to sink current from the load on the output of amplifier 12. It also causes M39 to pull the output of amplifier 12 down toward ground. Ideally, $V_{out}$ could pull down to the circuit ground, however, as $V_{out}$ reaches $V_{t(M39)}$, M39 stops conducting. Therefore M39 is processed such that it has an extremely low $V_t$ $(V_{t(M39)}\approx 0.1V)$ and $V_{out}$ has an extremely high output swing. $V_{out}$ gets within 0.54V of circuit ground in the preferred embodiment wherein prior art transconductance amplifiers typically get only to about 1.2V of circuit ground.

A discussion of how amplifier 12 advantageously provides an enable/disable function follows below. PSHUT and NSHUT are input signals that provide the enable/disable feature for amplifier 12. When PSHUT input is at a voltage greater than the threshold voltages of M28, M42, and M77 and when NSHUT input is at a voltage less than the threshold voltages of M24 and M41 amplifier 12 is enabled and may provide its desired functionality depending upon the state of inputs IN+ and IN−. Under these conditions M28, M42, M77, M24, and M41 are all biased off and therefore are not conducting and act like open circuits thereby not interfering with the operation of amplifier 12.

If PSHUT is at a voltage value less than the threshold voltages of M28, M42, and M77 and if NSHUT is at a voltage greater than the threshold voltages of M24 and M41, amplifier 12 is disabled. PSHUT and NSHUT provide this function in the following manner. Transistors M28, M42, M77, M24, and M41 all begin conducting. Therefore M28 pulls the gates of M25 and M29 up to Vcc which forces both of the transistors off thereby rendering the current mirror composed of M25 and M29 inoperative. In a similar manner, the conduction of M42 pulls the gates of M32 and M33 up to Vcc thus turning them off. Also, the conduction of M77 pulls the gates of M37 and M39 up to Vcc which turns them off. Therefore, the current mirror formed by M32 and M33 is inoperative as is the mirror formed by M37 and M39. The conduction of M24 pulls the gates of M22 and M23 down to ground thus turning them both off and making the current mirror made by M22 and M23 inoperative. Similarly, the conduction of M41 pulls the gates of M34 and M35 down to ground thus turning them both off and rendering the current mirror formed by M34 and M35 inoperative. Under these conditions no current is available to source the differential input formed by M26 and M27. Further, no current is available for output transistors M39 and M40 to drive an output load. In this condition, amplifier 12 is turned off with virtually no standby power (the existing standby power in this condition is associated only with device leakages).

A discussion of how amplifier 12 achieves low output impedance follows below: amplifier 12 incorporates transistors M39 and M40 to form a source follower output which provides a low output impedance. A source follower output configuration has an output impedance of approximately $1/(g_{m(M39)}+g_{m(M40)})$ while an open drain output configuration (which is a common output configuration for amplifiers) has an output impedance of approximately $1/(g_{o(M39)}+g_{o(M40)})$. (Sedra and Smith, Microelectronic Circuit, Second Edition, CBS College Publishing, 1987, pp. 359-363). The output impedance of the source follower output configuration is significantly smaller than that of the open drain output as can be readily seen below:

$$I_d = (k'/2)(W/L)(V_{gs}-V_t)^2(1+\lambda V_{ds})$$

and $$g_m = \delta(I_d)/\delta(V_{gs}) = k'(W/L)(V_{gs}-V_t) \approx [2k'(W/L)I_d]^{\frac{1}{2}} \text{ for } \lambda V_{ds} < < 1.$$

$$g_o = \delta(I_d)/\delta(V_{ds}) = (k'/2)(W/L)(V_{gs}-V_t)^2\lambda = \lambda I_d.$$

Therefore using standard values of: $\lambda=0.01/V$, $k'=20$ $\mu A/V^2$, $(W/L)=100$, and $I_d=100$ $\mu A$.

$$g_m = 632 \ \mu A/V,$$

$$g_o = 1 \ \mu A/V,$$

therefore, $$r_o(\text{source follower}) \approx 791 \Omega$$

$$r_o(\text{open drain}) = 500 k\Omega,$$

which assumes that $g_{m(M39)}=g_{m(M40)}$ and $g_{o(M39)}=g_{o(M40)}$.

Therefore, the output impedance of the source follower is approximately 600 times smaller than the open drain configuration. The source follower configuration provides excellent slew rate characteristics since slew rate of amplifier $12 = r_o*C_{eff}$. Open drain outputs can improve their output impedance by increasing the current $I_d$, however voltage regulator 10 requires a low quiescent current and therefore eliminates an open drain output configuration as a viable alternative.

The combination of source follower outputs, CMOS technology, extremely low threshold voltage output transistors, and enable/disable circuitry provide a transconductance amplifier that exhibits low output impedance, low quiescent current, high output swing, and disable capability.

It should also be understood that this invention is not limited to transonductance amplifiers, but may find applicability in any operational amplifier design.

Although the invention has been described with reference to the preferred embodiment herein, this description is not to be construed in a limiting sense. Various modifications of the disclosed embodiment as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. A low quiescent current, high output swing, low output impedance transconductance amplifier, comprising:

a first PMOS transistor having a source, a gate forming a first input, and a drain;

a second PMOS transistor having a source connected to the source of the first PMOS transistor, a gate forming a second input, and a drain;

a third PMOS transistor having a source connected to a first voltage source, a gate, and a drain connected to the source of the first PMOS transistor;

a fourth PMOS transistor having a source connected to the first voltage source, a gate connected to the gate of the third PMOS transistor, and a drain connected to its gate;

a fifth PMOS transistor having a source connected to the first voltage source, a gate connected to a first disable input, and a drain connected to the gate of the third PMOS transistor;

a sixth PMOS transistor having a source connected to the first voltage source, a gate, and a drain connected to its gate;

a seventh PMOS transistor having a source connected to the first voltage source, a gate connected to the gate of the sixth PMOS transistor, and a drain;

an eighth PMOS transistor having a source connected to the first voltage source, a gate connected to the first disable input, and a drain connected to the gate of the sixth PMOS transistor;

a ninth PMOS transistor having a source connected to the first voltage source, a gate connected to the first disable input, and a drain;

a tenth PMOS transistor having a source, a gate connected to the drain of the ninth PMOS transistor, and a drain connected to its gate;

an eleventh PMOS transistor having a source, a gate connected to the gate of the tenth PMOS transistor, and a drain connected to a second voltage source;

a first NMOS transistor having a drain connected to a current source, a gate connected to its drain, and a source connected to the second voltage source;

a second NMOS transistor having a drain connected to the gate of the first NMOS transistor, a gate connected to a second disable input, and a source connected to the second voltage source;

a third NMOS transistor having a drain connected to the drain of the fourth PMOS transistor, a gate connected to the gate of the first NMOS transistor, and a source connected to the second voltage source;

a fourth NMOS transistor having a drain connected to the drain of the first PMOS transistor, a gate connected to its drain, and a source;

a fifth NMOS transistor having a drain connected to the drain of the sixth PMOS transistor, a gate connected to the gate of the fourth NMOS transistor, and a source;

a sixth NMOS transistor having a drain connected to the drain of the second PMOS transistor, a gate connected to its drain, and a source;

a seventh NMOS transistor having a drain connected to the drain of the tenth PMOS transistor, a gate connected to the gate of the sixth NMOS transistor, and a source;

an eighth NMOS transistor having a drain connected to the gate of the sixth NMOS transistor, a gate connected to the second disable input, and a source connected to the second voltage source;

a ninth NMOS transistor having a drain connected to the drain of the seventh PMOS transistor, a gate connected to its drain, and a source connected to the source of the tenth PMOS transistor;

a tenth NMOS transistor having a drain connected to the first voltage source, a gate connected to the gate of the ninth NMOS transistor, and a source connected to the source of the eleventh PMOS transistor and forming an output of the amplifier;

a capacitance having a first terminal connected to the drain of the second PMOS transistor and a second terminal connected to the output of the amplifier;

a first resistance having a first terminal connected to the source of the fourth NMOS transistor and a second terminal connected to the second voltage source;

a second resistance having a first terminal connected to the source of the fifth NMOS transistor and a second terminal connected to the second voltage source;

a third resistance having a first terminal connected to the source of the sixth NMOS transistor and a second terminal connected to the second voltage source; and a fourth resistance having a first terminal connected to the source of the seventh NMOS transistor and a second terminal connected to the second voltage source.

2. The amplifier of claim 1 wherein the first NMOS transistor, the fourth NMOS transistor, the fifth NMOS transistor, the sixth NMOS transistor, the ninth NMOS transistor, the fourth PMOS transistor, the sixth PMOS transistor, and the tenth PMOS transistor have a (W/L) size ratio of one, the third NMOS transistor, the seventh NMOS transistor, and the seventh PMOS transistor have a (W/L) size ratio of two, the third PMOS transistor has a (W/L) size ratio of four, and the tenth NMOS transistor and the eleventh PMOS transistor have a (W/L) size ratio of five.

3. The amplifier of claim 1 wherein the tenth NMOS transistor has a gate to source threshold voltage less than 0.2V and the eleventh PMOS transistor has a gate to source threshold voltage greater than $-0.2$V.

* * * * *